(12) United States Patent
Tu et al.

(10) Patent No.: US 11,945,907 B2
(45) Date of Patent: Apr. 2, 2024

(54) LIQUID CRYSTAL POLYMER FILM AND LAMINATE COMPRISING THE SAME

(71) Applicant: Chang Chun Plastics Co., Ltd., Taipei (TW)

(72) Inventors: An-Pang Tu, Taipei (TW); Chia-Hung Wu, Taipei (TW); Chien-Chun Chen, Taipei (TW)

(73) Assignee: CHANG CHUN PLASTICS CO., LTD., Taipei (TW)

( * ) Notice: Subject to any disclaimer, the term of this patent is extended or adjusted under 35 U.S.C. 154(b) by 35 days.

(21) Appl. No.: 17/126,431

(22) Filed: Dec. 18, 2020

(65) Prior Publication Data
US 2021/0187884 A1    Jun. 24, 2021

Related U.S. Application Data

(60) Provisional application No. 62/952,553, filed on Dec. 23, 2019.

(51) Int. Cl.
| | |
|---|---|
| B09B 3/80 | (2022.01) |
| B29C 41/12 | (2006.01) |
| B29D 7/01 | (2006.01) |
| B32B 15/09 | (2006.01) |
| B32B 15/20 | (2006.01) |
| B32B 27/36 | (2006.01) |
| C08G 63/06 | (2006.01) |
| C08G 63/60 | (2006.01) |
| C08G 63/83 | (2006.01) |
| C08J 5/18 | (2006.01) |
| C08L 67/04 | (2006.01) |
| C09K 19/38 | (2006.01) |
| H05K 1/03 | (2006.01) |
| B29K 67/00 | (2006.01) |
| B29K 105/00 | (2006.01) |

(52) U.S. Cl.
CPC ............ *C08G 63/065* (2013.01); *B29C 41/12* (2013.01); *B29D 7/01* (2013.01); *B32B 15/09* (2013.01); *B32B 15/20* (2013.01); *B32B 27/36* (2013.01); *C08G 63/06* (2013.01); *C08G 63/60* (2013.01); *C08G 63/83* (2013.01); *C08J 5/18* (2013.01); *C08L 67/04* (2013.01); *C09K 19/3809* (2013.01); *H05K 1/032* (2013.01); *B29K 2067/00* (2013.01); *B29K 2105/0079* (2013.01); *B32B 2250/03* (2013.01); *B32B 2250/40* (2013.01); *B32B 2305/55* (2013.01); *B32B 2307/538* (2013.01); *B32B 2307/704* (2013.01); *B32B 2307/732* (2013.01); *B32B 2457/08* (2013.01); *C08G 2250/00* (2013.01); *C08J 2367/04* (2013.01); *C08L 2203/16* (2013.01); *H05K 2201/0141* (2013.01)

(58) Field of Classification Search
CPC ............... C08J 11/08; B09B 3/80; B09B 3/40

USPC ......................................................... 521/46
See application file for complete search history.

(56) References Cited

U.S. PATENT DOCUMENTS

| | | |
|---|---|---|
| 5,534,209 A | 7/1996 | Moriya |
| 5,746,949 A | 5/1998 | Shen et al. |

(Continued)

FOREIGN PATENT DOCUMENTS

| | | |
|---|---|---|
| CN | 1235173 A | 11/1999 |
| CN | 101423652 A | 5/2009 |

(Continued)

OTHER PUBLICATIONS

JP 201154945 Organic Electrolyte-type Electrical Storage Device for E.g. Hybrid Vehicle, Is Externally-equipped With Thermotropic Liquid Crystal Polymer Film Having Linear Expansion Coefficient Along Planar Direction of Specified Value (Year: 2011).*
KR 20160065942 Machine Translation; Thermoplastic Liquid Crystal Polymer Film, Circuit Board, and Methods Respectively for Manufacturing Said Film and Said Circuit Board (Year: 2016).*
WO201617174868A1 machine translation (Year: 2016).*
Examination Report of JP2020-199487 (dated Aug. 26, 2021).
Examination Report of JP2020-210267(dated Oct. 8, 2021).
Examination Report of JP2020-210276(dated Oct. 14, 2021).

(Continued)

*Primary Examiner* — Terressa Boykin
(74) *Attorney, Agent, or Firm* — WPAT, PC

(57) ABSTRACT

Provided are an LCP film and a laminate comprising the same. The LCP film is made of an LCP resin comprising a structural unit represented by Formula (1): -$L_1$-Ar-$L_2$- (1), wherein -$L_1$- and -$L_2$- are respectively —O— or —CO—; —Ar— is an arylene group. Formula (1) comprises structural units

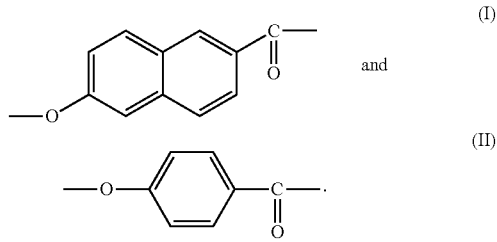

Based on a total molar number of the structural unit represented by Formula (1), a molar number of the structural unit represented by Formula (I) is in the range from 15 mole % to mole %, and a sum of molar numbers of the structural units represented by Formulae (I) and (II) is in the range from 80 mole % to 100 mole %. The LCP film has a thickness and a transmittance, wherein when values of the thickness (in μm) and the transmittance are put into Formula (III), the obtained value is from 0.055 to 0.090. Formula (III): $\mathrm{Log}(1/\mathrm{TT}\,\%)/(\mathrm{Thickness})^{0.5}$.

13 Claims, No Drawings

(56) References Cited

U.S. PATENT DOCUMENTS

| | | |
|---|---|---|
| 5,998,804 A | 12/1999 | Suh et al. |
| 6,859,241 B2 | 2/2005 | Hamamoto |
| 9,874,439 B2 | 1/2018 | Bucher |
| 2002/0060309 A1 | 5/2002 | Jester |
| 2006/0048963 A1 | 3/2006 | Nishinaka et al. |
| 2009/0033839 A1 | 2/2009 | Fukuda |
| 2014/0135469 A1 | 5/2014 | Kim et al. |
| 2017/0347464 A1 | 11/2017 | Hashizume |
| 2018/0147815 A1 | 5/2018 | Hashizume |
| 2018/0230317 A1 | 8/2018 | Seo |
| 2019/0091970 A1 | 3/2019 | Ueki |
| 2019/0160728 A1 | 5/2019 | Higashioji |
| 2019/0352456 A1 | 11/2019 | Hsiang et al. |
| 2020/0407639 A1 | 12/2020 | Liao |
| 2021/0187884 A1 | 6/2021 | Tu |
| 2021/0189118 A1 | 6/2021 | Tu |
| 2021/0189242 A1 | 6/2021 | Tu |

FOREIGN PATENT DOCUMENTS

| | | |
|---|---|---|
| CN | 101921469 A | 12/2010 |
| CN | 102085708 A | 6/2011 |
| CN | 102574362 A | 7/2012 |
| CN | 1030699933 A | 4/2013 |
| CN | 109180979 A | 1/2019 |
| CN | 109196716 A | 1/2019 |
| CN | 110073282 A | 7/2019 |
| CN | 112586096 A | 3/2021 |
| CN | 115768820 A | 3/2023 |
| EP | 3424703 A1 | 1/2019 |
| JP | S59157115 A | 9/1984 |
| JP | H0317156 A | 1/1991 |
| JP | H05-214253 A | 8/1993 |
| JP | H06-240019 A | 8/1994 |
| JP | H07-251438 A | 10/1995 |
| JP | H08-090570 A | 4/1996 |
| JP | H08-281817 A | 10/1996 |
| JP | 258750 B2 | 3/1997 |
| JP | 2962459 B2 | 10/1999 |
| JP | 2000006351 A | 1/2000 |
| JP | 2000044797 A | 2/2000 |
| JP | 2003-340918 A | 12/2003 |
| JP | 2004-323663 A | 11/2004 |
| JP | 2005-297405 A | 10/2005 |
| JP | 2006-001185 A | 1/2006 |
| JP | 2006-249159 A | 9/2006 |
| JP | 3896324 B2 | 3/2007 |
| JP | 2007-092036 A | 4/2007 |
| JP | 2007-126578 A | 5/2007 |
| JP | 2007-217579 A | 8/2007 |
| JP | 2007203702 A | 8/2007 |
| JP | 4091209 B2 | 5/2008 |
| JP | 2008-221488 A | 9/2008 |
| JP | 2008-291168 A | 12/2008 |
| JP | 2009164596 A | 7/2009 |
| JP | 2010-076295 A | 4/2010 |
| JP | 2010147442 A | 7/2010 |
| JP | 2011-5803 A | 1/2011 |
| JP | 2011071815 A | 4/2011 |
| JP | 2011-216598 A | 10/2011 |
| JP | 201154945 * | 11/2011 |
| JP | 2012089608 A | 5/2012 |
| JP | 2012-167224 A | 9/2012 |
| JP | 2012-186453 A | 9/2012 |
| JP | 2012169598 A | 9/2012 |
| JP | 2013155415 A | 8/2013 |
| JP | 2013158935 A | 8/2013 |
| JP | 2014060449 A | 4/2014 |
| JP | 2014208438 A | 11/2014 |
| JP | 2015066910 A | 4/2015 |
| JP | 2015077783 A | 4/2015 |
| JP | 2016084528 A | 5/2016 |
| JP | 2016-107505 A | 6/2016 |
| JP | 2016129949 A | 7/2016 |
| JP | 2016131193 A | 7/2016 |
| JP | 201653751 A | 12/2016 |
| JP | 2017-031442 A | 2/2017 |
| JP | 2017-135216 A | 8/2017 |
| JP | 2017189894 A | 10/2017 |
| JP | 6277576 B2 | 2/2018 |
| JP | 2018028147 A | 2/2018 |
| JP | 2018-121085 A | 8/2018 |
| JP | 2018-172785 A | 11/2018 |
| JP | 2018168409 A | 11/2018 |
| JP | 2018172790 A | 11/2018 |
| JP | 2019-043980 A | 3/2019 |
| JP | 2019117414 A | 7/2019 |
| JP | 2019123255 A | 7/2019 |
| JP | 2019-135301 A | 8/2019 |
| JP | 2019152853 A | 9/2019 |
| JP | 2022508617 A | 1/2022 |
| KR | 1020050043649 A | 5/2005 |
| KR | 10-2009-0077767 A | 7/2009 |
| KR | 1020110103068 A | 9/2011 |
| KR | 20160065942 * | 6/2012 |
| KR | 10-2012-0074230 A | 7/2012 |
| KR | 2016-0065942 A | 6/2016 |
| KR | 10-2017-0103835 A | 9/2017 |
| TW | 201417646 A | 5/2014 |
| TW | 201533280 A | 9/2015 |
| TW | 201928029 A | 7/2019 |
| TW | 201939077 A | 10/2019 |
| TW | 201941933 A | 11/2019 |
| TW | I697549 B | 7/2020 |
| WO | WO2010093009 A1 | 8/2010 |
| WO | 2010139053 A1 | 12/2010 |
| WO | 2011111826 A1 | 9/2011 |
| WO | 2011118449 A1 | 9/2011 |
| WO | 2012/117850 A1 | 9/2012 |
| WO | WO2013021893 A1 | 2/2013 |
| WO | WO2013108563 A1 | 7/2013 |
| WO | 2014046014 A1 | 3/2014 |
| WO | 2016104420 A | 6/2016 |
| WO | WO2016136537 A1 | 9/2016 |
| WO | WO2016159060 A1 | 10/2016 |
| WO | WO2016170779 A1 | 10/2016 |
| WO | WO-2016174868 A1 * | 11/2016 | ............. B32B 15/08 |
| WO | WO2016174868 A1 | 11/2016 |
| WO | 2016194964 A | 12/2016 |
| WO | 2018/181223 A1 | 10/2018 |
| WO | 2018/186223 A1 | 10/2018 |
| WO | WO2018181222 A1 | 10/2018 |
| WO | 2020009230 A1 | 1/2020 |
| WO | 2020149324 A1 | 7/2020 |
| WO | WO2020156181 A1 | 8/2020 |
| WO | 2021256491 A1 | 12/2021 |

OTHER PUBLICATIONS

Third Party Observation of JP2020-210276(receiving date: Oct. 20, 2021).
Notice of Panel Decision from Pre-Appeal Brief Review of U.S. Appl. No. 16/748,846(receiving date: Sep. 17, 2021).
Examination Report of JP2020-166621(dated Nov. 5, 2021).
Third Party Observation of JP2020-166621(receiving date: Oct. 28, 2021).
Examination Report of KR10-2020-0180055 (dated Dec. 10, 2021).
Examination Report of KR10-2020-0128117 (dated Dec. 22, 2021).
Examination Report of KR10-2020-0180073 (dated Dec. 29, 2021).
Vlachopoulos J., Polychronopoulos N.D., Tanifuji S., Peter Müller J. (2012).
Examiner's Answer to Appeal Brief of U.S. Appl. No. 16/748,846 (receiving date: Dec. 20, 2021).
Notice of Allowance of JP2020-210267 (dated Jan. 11, 2022).
Notice of Cancellation Grounds of KR10-2020-0044558 (receiving date: Dec. 27, 2021).
Third Party Observation of KR10-2020-0128117 (receiving date: Feb. 4, 2022).
Third Party Observation of KR10-2020-0180073 (receiving date: Feb. 22, 2022).
IPAB Decision on Appeal of KR10-2020-0044558 (receiving date: May 17, 2022).

(56) References Cited

OTHER PUBLICATIONS

Final Examination Report of KR10-2020-0180073 (dated Apr. 28, 2022).
Examination Report of KR10-2020-0128117 (dated Jun. 22, 2022).
Examination Report of U.S. Appl. No. 16/748,846 (dated May 17, 2022).
Third Party Observation of JP2020-210284 (receiving date: May 23, 2022).
Resilience Brother, 5G communication material—liquid crystal polymer LCP (2020), Text/Meter Polymer.
Hajnys et al. Quality of Surface Texture (2021) Polymers, MDPI.
Recent Market and Application Development of Liquid Crystal Polymers (2003).
Wang, Synthesis and Self-assembled Nanostructures of Rectangular Liquid Crystals (2007) National Chiao Tung Unversity, Taiwan.
Technologies & Applications of LCP (2004).
Vecstar catalog, Kuraray Co. Ltd. (2012), Japan.
Tanaka et al. LCP material for LSI Mounting (1999).
S-hydroxy-2-naphthoic acid, Tcichemicals.com, Japan.
4-hydroxybenzoic acid, Wikipedia.
Okamoto et al. Newly developed LCP film (2005), Sumitomo Chemical Co. Ltd., Japan.
Patent Board Decision of U.S. Appl. No. 16/748,846 (receiving date: Apr. 11, 2022).
Examination Report of U.S. Appl. No. 17/012,105 (dated Mar. 11, 2022).
Third Party Observation 1 of JP2020-166621 (receiving date: Mar. 8, 2022).
Third Party Observation 2 of JP2020-166621 (receiving date: Mar. 8, 2022).
Third Party Observation of JP2020-210284 (receiving date: Apr. 12, 2022).
Examination Report of JP2020-199487 (dated Mar. 22, 2022).
Examination Report of JP2020-166621 (dated Apr. 19, 2022).
Final Examination Report of JP2020-210276 (dated Mar. 15, 2022).
Third Party Observation of KR10-2020-1080090 (receiving date: Feb. 22, 2022).
Notice of Allowance of KR10-2020-0180055 (dated Apr. 14, 2022).
Catalog of Fukuda Metal Foil & Powder Co., LTD. (2015).
Technical Report of Panasonic Corporation (2011).
Evaluation of the strength of single lap joint by using geomertrical and adhesive color information (2015).
Web page for introduction of kurtosis.
Japanese dictionary Kojien 7th edition.
Technical Report of IEICE (1999).
Measures against molding defects in easy extrusion molding (1984).
Web page for Surface Roughness Measurement-Parameters.
The 26th Spring Lecture Meeting of the Electronics Packaging Society (2012).
Convertech, 2001.
Examination Report of JP2020-021487 dated Jul. 28, 2020.
Notice of Allowance of JP2020-021487 dated Nov. 4, 2020.
Examination Report of KR10-2020-0044558 dated Jun. 29, 2020.
Notice of Allowance of KR10-2020-0044558 dated Nov. 24, 2020.
Examination Report of U.S. Appl. No. 16/748,846 dated Sep. 10, 2020.
Final Rejection of U.S. Appl. No. 16/748,846 dated Dec. 9, 2020.
Rejection of RCE of U.S. Appl. No. 16/748,846 issue on Apr. 2, 2021.
Examination Report of TW108147226 dated Mar. 13, 2020.
Notice of Allowance of TW108147226 dated May 19, 2020.
Examination Report of TW109144672 dated Feb. 23, 2021.
Examination Report of TW109144673 dated Mar. 23, 2021.
Examination Report of TW109144674 dated Feb. 25, 2021.
Authors: MahaA Mekkawyet al.; Title: Comparative study of surface roughness between polyamide, thermoplastic polymethyl methacrylate and acetal resins flexible denture base materials before and after polishing; Published Date: Oct. 7, 2015.
Notice of Allowance of TW109144672 (dated Jun. 17, 2021).
Notice of Allowance of TW109144673 (dated Aug. 19, 2021).
Notice of Allowance of TW109144674 (dated May 6, 2021).
Notice of Allowance for Appeal of JP2020-210276 (dated Aug. 2, 2022).
Notice of Allowance of U.S. Appl. No. 17/012,105 (dated Nov. 17, 2022).
Notice of Allowance of U.S. Appl. No. 17/126,413 (dated Nov. 15, 2022).
Notice of Reason of Cancellation of JP2020-210267 (dated Nov. 15, 2022).
Notice of Allowance of KR10-2020-0128117 (dated Dec. 28, 2022).
Examination Report of JP2020-199487 (dated Oct. 18, 2022).
Examination Report of JP2020-210284 (dated Aug. 2, 2022).
Examination Report of KR10-2020-0180090 (dated Dec. 21, 2022).
Examination Report of U.S. Appl. No. 17/012,105 (dated Aug. 5, 2022).
Examination Report of U.S. Appl. No. 17/126,413 (dated Aug. 2, 2022).
Examination Report of U.S. Appl. No. 17/126,446 (dated Aug. 23, 2022).
Examination Report of U.S. Appl. No. 17/502,213 (dated Oct. 6, 2022).
Opposition 1 to JP2020-210267 (receiving date: Sep. 12, 2022).
Opposition 2 to JP2020-210267 (receiving date: Sep. 12, 2022).
Final Examination Report of KR10-2020-0180073 (dated Oct. 29, 2022).
Final Examination Report of U.S. Appl. No. 16/748,846 (dated Aug. 24, 2022).
Third Party Observation of JP2020-199487 (receiving date: Dec. 14, 2021).
Third Party Observation of JP2020-166621 (receiving date: Dec. 6, 2022).
Third Party Observation of U.S. Appl. No. 17/502,213 (receiving date: Aug. 8, 2022).
U.S. Appl. No. 62/952,553, (filed Dec. 23, 2019).
Patent Application No. JP2020-105862 (Jun. 22, 2020).
The New Color Science Handbook (Apr. 20, 2011).
Tech & Appli of LCP (Dec. 22, 2009).
Technology&application of LCP (Dec. 22, 2009).
Rz, Rku, Ra of examples of JP2020-166621 (Jul. 1, 2021).
Roughness webpage.
NDH5000 Haze Meter Introduction (2007).
LCP applied into LED (Nov. 30, 2011).
Kuraray webpage.
Konica webpage.
JISK7375:2008.
JISK7361-1:1997.
JISK7136:2000.
Geometrical Product Specifications (JISB0601:2013).
Geometrical Product Specifications (JISB0601:2001).
Fukuda catalog (Dec. 1, 2019).
Dielectrical characteristic & appli of LCP (Nov. 1, 2015).
Standard Test Method for Haze and Luminous Transmittance of Transparent Plastics (ASTM D1003-00).
ASTM D1003-13 (2021).
5G loss insertion (Aug. 2017).
Development of multilayer flex substrate with LCP film.
ULTRALAM3000 (May 10, 2011).
Improvement of dielectric property of LCP (Jul. 17, 2014).
Claims of JP2020-201284.
Decision on Opposition of JP2020-21487 (receiving date: Sep. 13, 2021).
Corrected Notice of Allowance of U.S. Appl. No. 17/012,105 (dated Dec. 23, 2022).
Taiwan Examination Report of related TW 109117530 (dated May 24, 2021).
Taiwan Notice of Allowance of related TW 109117530 (dated Aug. 6, 2021).
Japan Statement of Opposition of related JP 6804673 (receiving date: Jul. 16, 2021).
Korea Statement of Opposition of related KR 10-2197515 (receiving date: Aug. 6, 2021).

(56) References Cited

OTHER PUBLICATIONS

Author: Misumi Co., title: Misumi-vona technical report, URL:https://jp.misumi-ec.com/tech-info/categories/technical_data/td01/g0103.html (upload date: Mar. 6, 2021).
Examination Report of JP2020-166621 (dated Jan. 17, 2023).
Examination Report of U.S. Appl. No. 16/748,846 (dated Jan. 24, 2023).
Examination Report of CN202011494501.1 (dated Jan. 5, 2023).
Final Examination Report of U.S. Appl. No. 17/126,446 (dated Jan. 12, 2023).
Corrected Notice of Allowance 1 of U.S. Appl. No. 17/012,105 (dated Jan. 23, 2023).
Corrected Notice of Allowance 2 of U.S. Appl. No. 17/012,105 (dated Feb. 15, 2023).
Supplemental NOA 1 of U.S. Appl. No. 17/126,413 (dated Jan. 20, 2023).
Supplemental NOA 2 of U.S. Appl. No. 17/126,413 (dated Feb. 8, 2023).
Third Party Observation of JP2020-210284 (dated Jan. 24, 2023).
Email related to U.S. Appl. No. 17/012,105 received on Dec. 15, 2022 and its brief comment.
Email related to U.S. Appl. No. 17/126,413 received on Dec. 28, 2022 and its brief comment.
LED light-color temperature(2019).
Analysis and comparison of the standard test methods(Nov. 20, 2005).
Turbidity Meter Haze Meter NDH 5000 (Jun. 8, 2017).
New Product Introduction—For Flexible Display; published by Nippon Fine Chemical; Mar. 19, 2022 <URL:https://www.nipponseika.co.jp/business/nsc/flexible-display/>.
Insertion Loss Comparisons of Common High Frequency PCB Constructions; John Coonrod, Rogers Corporation; published in the IPC APEX EXPO Conference Proceedings; Feb. 20, 2013.
About the mechanical and electrical properties of polyethylene; published by Tokyo Electric Power Company Holdings, Inc.; Jun. 12, 2018.
Examination Report of JP2020-210284 (dated Mar. 14, 2023).
Third Party Observation of JP2020-199487 (dated Mar. 22, 2023).
Opposition to JP2020-210276 (issuing date: Mar. 24, 2023).
Panasonic FELIOS LCP, published by Panasonic, Jun. 2019.
A Comparative Study of Aerosol Jet Printing on Polyimide and Liquid Crystal Polymer Substrates for RF Applications: Mohammed Alhendi et al.; Published in 2020 IEEE 70th Electronic Components and Technology Conference (ECTC), Aug. 5, 2020.
Commercialization of Low Transmission Loss Flexible Multilayer Circuit Board Materials, published by Panasonic Holdings Co., Ltd., webpage <URL: https://news.panasonic.com/jp/press/jn170117-3>, Jan. 17, 2017.
Introduction of Roughness, published by Keyence corporation, webpage <URL: https://www.keyence.co.jp/ss/products/microscope/roughness/basics/type.jsp>, <URL: https://www.keyence.co.jp/ss/products/microscope/roughness/surface/parameters/sa.jsp> and <URL: https://www.keyence.co.jp/se/products/microscope/roughness/surface/parameters/sz.jsp>, retrieved on Dec. 28, 2022.
Development trends of high-frequency compatible materials and their application to 5G and millimeter-wave radar, published by Technical information association, Jun. 7, 2019.
Development technology of liquid crystal polymer-High performance and high functionality, published by CMC Publishing Co., Ltd., Dec. 22, 2009.
Electronics Materials for the Ubiquitous Era, published by CMC Publishing Co., Ltd., Dec. 26, 2003.
Information of 4-Hydroxybenzoic Acid, published by Tokyo Chemical Industry Co., Ltd., webpage <URL: https://www.tcichemicals.com/JP/ja/p/H0207<, Dec. 18, 2021, retrieved from Internet Archive <https://web.archive.org/web/20230000000000*/https://www.tcichemicals.com/JP/ja/p/H0207< on Apr. 12, 2023.
2008 (Gyo-ke) No. 10096 Intellectual Property High Court Judgment, published by Intellectual Property High Court, Jan. 28, 2009.
ISO Home Page for ISO 25178 2:2021, published by International Organization for Standization, webpage.
Examination Report of CN202010073759.8 (dated May 20, 2023).
Examination Report of JP2020-199487 (dated Apr. 25, 2023).
Notice of Reason of Cancellation of JP2020-210276 (dated Jun. 15, 2023).
Decision for Appeal of KR10-2020-0180073 (dated Jun. 7, 2023).
Decision on Opposition of JP2020-210267 (dated Jun. 23, 2023).
Opinion of Patent Opponent 1 of JP2020-210267 (dated Jun. 23, 2023).
Opinion of Patent Opponent 2 of JP2020-210267 (dated Jun. 23, 2023).
Notice of Allowance of U.S. Appl. No. 17/126,446 (dated Jun. 7, 2023).
Notice of Allowance of JP2020-166621 (dated Jun. 13, 2023).
Supplemental NOA 3 of U.S. Appl. No. 17/126,413 (dated Apr. 20, 2023).
Supplemental NOA 3 of U.S. Appl. No. 17/126,413 (dated Apr. 27, 2023).
Supplemental NOA 5 of U.S. Appl. No. 17/126,413 (dated May 5, 2023).
Supplemental NOA 6 of U.S. Appl. No. 17/126,413 (dated May 22, 2023).
Supplemental NOA 7 of U.S. Appl. No. 17/126,413 (dated Jun. 22, 2023).
[From light bulb color to daylight color] Explanation of the types of LED colors and their characteristics, webpage <URL: https://greenutility.co.jp/led-light-bulb-color/>, May 24, 2022, Published by Green Utility Co., Ltd.
Precautions for high-speed serial transmission on printed wiring boards, printed by the opponent 1 of Japanese application No. 2020-210267 on Mar. 24, 2023, webpage <URL: http://www.ritael.co.jp/archive/20060401a04/>, Nov. 26, retrieved from Internet Archive <https://web.archive.org/web/20191201000000*/https://www.ritael.co.jp/archive/20060410a04/> on Jul. 6, 2023, published by RITA Electronics Co., Ltd.
LED Lights: What is the difference between Warm White and Cool White?, webpage <URL: https://www.renovatorstore.com.au/blog/led-lights-what-is-the-difference-between-warm-white-and-cool-white/>, May 29, 2017, published by renovationstore.
What's the difference Between Warm White and Cool White LEDs?, printed by the opponent 2 of Japanese application No. 2020-210267 on Mar. 15, 2023, webpage <URL: https://socketstore.co.uk/page/help/lighting/leds-difference-between-warm-white-and-cool-white<, Oct. 10, 2021, retrieved from Internet Archive<https://web.archive.org/web/2021100100000*/https://socketstore.co.uk/page/help/lighting/leds-difference-between-warm-white-and-cool-white> on Jul. 6, 2023, published by socketstore.
Experience the beauty of warm white LED lighting, printed by the opponent 2 of Japanese application No. 2020-210267 on Mar. 15, 2023, webpage <URL: https://www.lighting.philips.com.my/consumer/led-lights/warm-led-light#slide_Flame_(2200K)>, Sep. 18, 2020, retrieved from Internet Archive <https://web.archive.org/web/2020090100000*/https://www.lighting.philips.com.my/consumer/led-lights-warm-led-light> on Jul. 6, 2023,published by Philips.
White LED: How to make white light?, printed by the opponent 2 of Japanese application No. 2020-210267 on Mar. 13, 2023, webpage <URL: https://www.rohm.co.jp/electronics-basics/led/led_what3>, Jun. 22, 2019, retrieved from Internet Archive <https://web.archive.org/web/20190701000000*/https://www.rohm.co.jp/electronics-basics/led/led_what3> on Jul. 6, 2023, published by Rohm Co., Ltd.
Haze Guard i, printed by the opponent 2 of Japanese application No. 2020-210267 on Mar. 8, 2023, webpage <URL: https://www.tetsutani.co.jp/sokutei/hazegard.html<, Aug. 12, 2020, retrieved from Internet Archive <https://web.archive.org/web/20200901000000*/https://www.tetsutani.co.jp/sokutei/hazegard.html> on Jul. 6, 2023, published by Tetsutani & Co., Ltd.
Color temperature exchange filter (LA, LB), printed by the opponent 2 of Japanese application No. 2020-210267 on Mar. 8, 2023, webpage <URL: https://www.hoyacandeo.co.jp/japanese/products/eo/color/06.html>, Oct. 14, 2018, retrieved from Internet Archive <https://web.archive.org/web/20181101000000*/https://www.

(56) References Cited

OTHER PUBLICATIONS hoyancandeo.co.jp/english/products/eo/color/06.html> on Jul. 6, 2023, published by Hoya Group Optics Division.
Examination Report of CN202011494501.1 (dated Jun. 22, 2023).
IPC-TM-650 test methods manual, Apr. 2014, published by IPC International, Inc.
Final Examination Report of U.S. Appl. No. 16/748,846 (dated Jul. 12, 2023).
Supplemental NOA 1 of U.S. Appl. No. 17/126,413 (dated Jul. 27, 2023).
Examination Report of CN202011494479.0 (dated Aug. 1, 2023).
Examination Report of CN202011498748.0 (dated Aug. 5, 2023).
Notice of Allowance of U.S. Appl. No. 17/126,446 (dated Aug. 23, 2023).
Supplemental NOA 2 of U.S. Appl. No. 17/126,413 (dated Aug. 28, 2023).
Supplemental NOA 3 of U.S. Appl. No. 17/126,413 (dated Aug. 30, 2023).
Notice of Allowance of CN202011494501.1 (dated Aug. 30, 2023).
Notice of Allowance of KR10-2020-0180090 (dated Aug. 31, 2023).
Ra changes when the cutoff changes, webpage <URL: https://michmet.com/ra-changes-when-the-cutoff-changes/>, Aug. 9, 2022, retrieved from the Internet Archive <https://web.archive.org/web/20220815000000*/https://michmet.com/ra-changes-when-the-cutoff-changes/> on Sep. 8, 2023, published by Michigan Metrology, LLC.
Notice of Allowance of JP2020-210284 (dated Oct. 3, 2023).
Supplemental NOA of U.S. Appl. No. 17/126,413 (dated Oct. 4, 2023).
Notice of Allowance of JP2020-199487 (dated Oct. 10, 2023).
Supplemental NOA of U.S. Appl. No. 17/126,413 (dated Oct. 27, 2023).
Corrected NOA of U.S. Appl. No. 17/126,446 (dated Nov. 16, 2023).
Notice of Grounds for Revocation of JP7125468 (dated Dec. 19, 2023).
Opinion of Patent Opponent of JP7125468 (dated Dec. 19, 2023).
Chemical Machining by Ferric Chloride Etchant, Ryuji Ueda (Toppan Printing Co., Ltd.) published by Boshoku Gijutsu, 38, 213-237 (Apr. 15, 1989), attached with the Opinion of Patent Opponent of JP7125468.
Electroless Copper Plating on Liquide Crystal Polymer Films, Koji Umehara et. al, published by Electronics Packaging Society Journal, vol. 7 No. 4, 328-332 (Jul. 1, 2004), attached with the Opinion of Patent Opponent of JP7125468.
1 Enclosures Catalogue Edition 5, published by ALLBRO, webpage <URL: https://www,allbro.com/download-catalogue/enclosures.pdf>, Oct. 28, 2020, retrieved from Internet Archive <https://web.archive.org/web/20201101000000*/https://www.allbro.com/download-catalogue/enclosures.pdf> on Dec. 26, 2023, attached with the Opinion of Patent Opponent of JP125468.
Corrected NOA of U.S. Appl. No. 17/126,446 (dated Jan. 11, 2024).
Examination Report of CN202010073759.8 (dated Jan. 19, 2024).

* cited by examiner

LIQUID CRYSTAL POLYMER FILM AND LAMINATE COMPRISING THE SAME

CROSS-REFERENCE TO RELATED APPLICATION

Pursuant to 35 U.S.C. § 119(e), this application claims the benefits of the priority to U.S. Provisional Patent Application No. 62/952,553, filed Dec. 23, 2019. The contents of the prior application are incorporated herein by its entirety.

BACKGROUND OF THE INVENTION

1. Field of the Invention

The present application relates to a polymer film for a laminate, more particularly to a liquid crystal polymer (LCP) film and a laminate comprising the same.

2. Description of the Prior Arts

A vigorous growth of the fields of optoelectronic technology, aerospace engineering, national defense and high-frequency mobile communications has been developed in recent years. Especially, the telecom industry actively develops the fifth generation mobile networks, abbreviated as 5G, so as to improve the performances, such as the data transfer rate, the response time, and the system capacity, etc. of the fourth generation mobile networks (4G). In the past, ceramics were used as the raw material; however, ceramics have drawbacks such as processing difficulty and high price. Thus, organic materials which are easy for processing at a lower price are desired to replace ceramics. It has been known that an LCP film has low moisture absorption, good chemical resistance, high gas barrier properties and low dielectric constant/dissipation factor (Dk/Df), so the LCP film becomes a main material for further development. Hence, the industry has been craving for the solution to improve the dielectric properties of the LCP film.

Patent Document 1 (JPH08-281817A) discloses a wholly aromatic liquid crystalline polyester film and the producing method thereof. The wholly aromatic liquid crystalline polyester is characterized by that its structure is composed of the structural units represented by Formulae (a) to (d) and the respective content thereof. Formula (a) is represented by

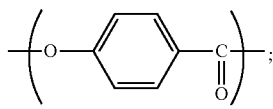

Formula (b) is represented by

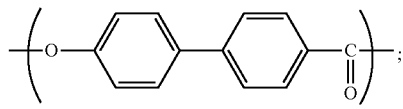

Formula (c) is represented by

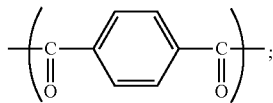

Formula (d) is represented by

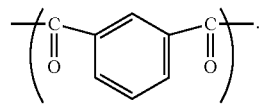

Since 5G communication technology uses high-frequency bands for signal transmission, the higher the signal frequency, the greater the insertion loss. In order to achieve signal transmission using high frequency bands, the above-mentioned LCP film whose material has the specific structures has not been satisfied with the needs of low insertion loss. Therefore, the insertion loss of the conventional LCP film is also awaited to be reduced, so as to develop laminates which are more suitable for 5G products.

SUMMARY OF THE INVENTION

In view of the foresaid problems, an objective of the present application is to enhance the dielectric properties of the LCP film, so the LCP film applied to the laminate for signal transmission can reduce insertion loss.

To achieve the aforementioned objective, one aspect of the present application provides an LCP film. The material of the LCP film is a liquid crystal polymer resin (LCP resin). The LCP resin comprises a structural unit represented by Formula (1):

$$-L_1-Ar-L_2- \qquad (1);$$

wherein $-L_1-$ and $-L_2-$ are respectively $-O-$ or $-CO-$; $-Ar-$ is an arylene group.

Formula (1) comprises structural units as follows:

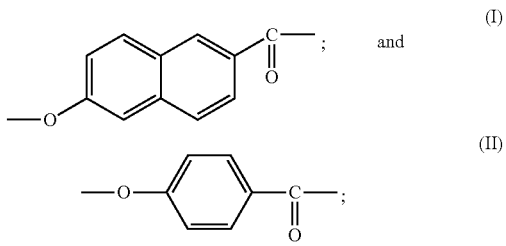

wherein based on a total molar number of the structural unit represented by Formula (1), a molar number of the structural unit represented by Formula (I) is in the range from 15 mole % to 40 mole %, and a sum of molar numbers of the structural units represented by Formulae (I) and (II) is in the range from 80 mole % to 100 mole %.

In addition, the LCP film has a thickness in the unit of micrometer (μm) and a transmittance (TT %). When values of the thickness and the transmittance are put into Formula (III), an obtained value is larger than 0.055 and smaller than 0.090.

$$\text{Log}(1/TT\ \%)/(\text{thickness})^{0.5} \qquad (III)$$

By using a thermotropic liquid crystal resin having a naphthalene-containing structural unit and a benzene-containing structural unit respectively in a specific content range the LCP film is produced; in addition, by collaboratively controlling the values of thickness and the transmittance of the LCP film, the resulting value obtained from Formula (III) can be controlled within a specific range, dielectric properties of such LCP film will be improved, and the insertion loss of said LCP film at a high frequency will be reduced.

In accordance with the present application, the thickness of the LCP film is not particularly restricted, as long as values of the thickness and the transmittance of the LCP film can make the resulting value obtained from Formula (III) be controlled within the specific range. Preferably, the thickness of the LCP film is in the range from 10 μm to 300 μm. More preferably, the thickness of the LCP film is in the range from 10 μm to 200 μm. Even more preferably, the thickness of the LCP film is in the range from 15 μm to 150 μm. Even more preferably, the thickness of the LCP film is in the range from 15 μm to 100 μm.

In accordance with the present application, the transmittance of the LCP film is not particularly restricted, as long as values of the transmittance and the thickness of the LCP film can make the resulting value obtained from Formula (III) be controlled within the specific range. Preferably, the transmittance of the LCP film is equal to or larger than 8% and smaller than 60%. More preferably, the transmittance of the LCP film is equal to or larger than 12% and smaller than 60%. Even more preferably, the transmittance of the LCP film is equal to or larger than 15% and smaller than or equal to 55%. The LCP film comprises a first surface and a second surface opposite each other. In one of the embodiments, a Kurtosis (Sku) of the first surface of the LCP film of the present application may be equal to or larger than 1 and smaller than or equal to 300; for example, 1, 5, 9, 10, 11, 12, 13, 15, 16, 20, 25, 50, 55, 60, 75, 100, 125, 150, 175, 200, 225, 250, 275 or 300. Preferably, the Sku of the first surface may be equal to or larger than 10 and smaller than or equal to 300. More preferably, the Sku of the first surface may be equal to or larger than 15 and smaller than or equal to 300. In LCP films having the same thickness, it is conducive to enhance the peel strength between the LCP film and the metal foil by controlling the Sku of the first surface of the LCP film.

In addition to the first surface of the LCP film, preferably, in one of the embodiments of the present application, a Sku of the second surface of the LCP film of the present application may also be equal to or larger than 1 and smaller than or equal to 300. More preferably, the Sku of the second surface may be equal to or larger than 10 and smaller than or equal to 300. Even more preferably, the Sku of the second surface may be equal to or larger than 15 and smaller than or equal to 300. In one of the embodiments, the Sku of the first surface and the Sku of the second surface of the LCP film of the present application may be the same or different. In another one of the embodiments, the Sku of the first surface and the Sku of the second surface of the LCP film of the present application may both fall within any of the aforementioned ranges. Accordingly, when the LCP film of the present application is applied to a laminate, regardless that the LCP film is stacked to at least one metal foil through either or both of the first surface and the second surface, the LCP film can possess superior adhesion to the at least one metal foil under the condition that the laminate maintains its merit of low insertion loss, thereby enhancing the peel strength between the LCP film and the at least one metal foil and avoiding the problem such as detachment of metal wire from the laminate in subsequent processes.

In one of the embodiments, an arithmetical mean height of a surface (Sa) of the first surface of the LCP film of the present application may be smaller than or equal to 0.29 μm. In another one of the embodiments, the Sa of the first surface of the LCP film of the present application may be equal to or larger than 0.02 μm and smaller than or equal to 0.29 μm; for example, 0.02 μm, 0.03 μm, 0.04 μm, 0.05 μm, 0.10 μm, 0.11 μm, 0.12 μm, 0.13 μm, 0.14 μm, 0.15 μm, 0.16 μm, 0.17 μm, 0.20 μm, 0.21 μm, 0.22 μm, 0.23 μm, 0.25 μm, 0.26 μm, 0.27 μm, 0.28 μm or 0.29 μm. Preferably, the Sa of the first surface of the LCP film of the present application may be equal to or larger than 0.03 μm and smaller than or equal to 0.20 μm. In the LCP films having the same thickness, it is conducive to enhance the peel strength between the LCP film and the metal foil by controlling the Sa of the first surface of the LCP film. Accordingly, under the condition that a laminate comprising the LCP film of the present application maintains the merit of low insertion loss, the LCP film can further possess high peel strength with the at least one metal foil, and thereby the laminate is more suitable for high-end 5G products.

In another one of the embodiments of the present application, the Sa of the second surface of the LCP film of the present application may be smaller than or equal to 0.29 μm. Preferably, the Sa of the second surface of the LCP film of the present application may be equal to or larger than 0.02 μm and smaller than or equal to 0.29 μm. More preferably, the Sa of the second surface of the LCP film of the present application may be equal to or larger than 0.03 μm and smaller than or equal to 0.20 μm. In one of the embodiments, the Sa of the first surface and the Sa of the second surface of the LCP film of the present application may both fall within any of the aforementioned ranges. The Sa of the first surface and the Sa of the second surface of the LCP film of the present application may be the same or different as needed. In one of the embodiments, the Sa of the first surface and the Sa of the second surface of the LCP film of the present application may both be equal to or larger than 0.02 μm and smaller than or equal to 0.29 μm.

In accordance with the present application, the LCP resin is commercially available or made from conventional raw materials. In the present application, the raw materials of the LCP resin are not particularly restricted, as long as the structural units derived therefrom can conform to the structural unit represented by Formula (1) and comprise the structural units respectively represented by Formulae (I) and (II) in suitable content ranges.

Based on the total molar number of the structural unit represented by Formula (1), the molar number of the structural unit represented by Formula (I) is in the range from 15 mole % to 40 mole %; preferably, in the range from 22 mole % to 27 mole %. Specifically, the structural units represented by Formula (I) may be derived from the following raw materials: ester derivatives of 2,6-naphthalenediol or 6-hydroxy-2-naphthalene carboxylic acid, etc.

Specifically, based on the total molar number of the structural unit represented by Formula (1), the molar number of the structural unit represented by Formula (II) may be in the range from 45 mole % to 85 mole %; preferably, the molar number of the structural unit represented by Formula (II) may be in the range from 55 mole % to 85 mole %. The structural units represented by Formula (II) may be derived from the following raw materials: ester derivatives of hydroquinone or 4-hydroxybenzoic acid, etc.

Preferably, the sum of the molar numbers of the structural units represented by Formulae (I) and (II) is larger than 85 mole % and smaller than or equal to 100 mole %. More preferably, the sum of the molar numbers of the structural units represented by Formulae (I) and (II) is equal to or larger than 86 mole % and smaller than or equal to 100 mole %.

Specifically, in addition to the above-mentioned compounds, the structural units represented by Formula (1) may also be derived from the following raw materials: resorcin, ester derivatives of resorcin, terephthalic acid (PTA), 2-chloroterephthalic acid, isophthalic acid, 2,6-naphthalenedicarboxylic acid, 3-hydroxybenzoic acid, 6-hydroxy-2-naphthalene carboxylic acid, 4'-hydroxy-4-biphenylcarboxylic acid, but it is not limited thereto.

Besides, other aromatic or aliphatic compounds may also be used as raw materials to prepare the LCP resin. For example, the aromatic compounds may be p-phenylenediamine, 4,4'-diaminobiphenyl, naphthalene-2,6-diamine, 4-aminophenol, 4-amino-3-methyl phenol or 4-aminobenzoic acid, etc. The aliphatic compounds may be ethanediol, 1,4-butanediol, 1,6-hexanediol or adipic acid, etc.

It can be understood that the raw materials used to make the LCP resin may be the aromatic compounds which can obtain the structural unit represented by Formula (1); or, the raw materials may further comprise the aromatic compounds which cannot obtain the structural unit represented by Formula (1); or, the raw materials may be the aliphatic compounds which cannot obtain the structural unit represented by Formula (1).

The LCP resin is made from the aforementioned raw materials, and then used to prepare the LCP film of the present application. In one of the embodiments of the present application, 6-hydroxy-2-naphthalenecarboxylic acid, 4-hydroxybenzoic acid and acetyl anhydride (also called as acetic anhydride) may be chosen to obtain the LCP resin, which can be used to prepare the LCP film of the present application. In one of the embodiments, the melting point of the LCP resin may be about 250° C. to 360° C.

In one of the embodiments, a person having ordinary skill in the art may add additives such as, but not limited to, lubricants, antioxidants, electrical insulating agents, or fillers during preparation of the LCP film of the present application based on different needs. For example, the applicable additives may be, but are not limited to, polycarbonate, polyamide, polyphenylene sulfide, or polyetheretherketone.

To achieve the aforementioned objective, another aspect of the present application provides a laminate, which comprises a first metal foil and said LCP film. The first metal foil is disposed over the first surface of the LCP film. That is, the first metal foil in the laminate of the present application is stacked onto the first surface of the LCP film.

In one of the embodiments, the laminate of the present application may further comprise a second metal foil, which is disposed over the second surface of the LCP film. That is, the LCP film of the present application is sandwiched between the first metal foil and the second metal foil. That is, the first metal foil in the laminate of the present application is stacked onto the first surface of the LCP film, and the second metal foil in said laminate is stacked onto the second surface of the LCP film. In this embodiment, when the surface characteristics, such as Sku and S a, of both of the first surface and the second surface of the LCP film are controlled at the same time, the adhesion of the LCP film stacked onto the first metal foil and the adhesion of the LCP film stacked onto the second metal foil are both improved, and thus the peel strength between the LCP film and the first metal foil as well as the peel strength between the LCP film and the second metal foil are both enhanced.

In accordance with the present application, "stacking" is not limited to stacking in a direct contact manner; further, it also includes stacking in an indirect contact manner. For example, in one of the embodiments of the present application, the first metal foil in the laminate is stacked onto the LCP film in a direct contact manner; that is, the first metal foil in the laminate is disposed over the first surface of the LCP film and the first metal foil in the laminate directly contacts the first surface of the LCP film. In another embodiment of the present application, the first metal foil in the laminate is stacked onto the LCP film in an indirect contact manner. For example, a connection layer may be disposed between the first metal foil and the LCP film based on different needs, so that the first metal foil contacts the first surface of the LCP film via the connection layer.

The material of the connection layer may be adjusted according to different needs to provide different functions. For example, the material of the connection layer may include nickel (Ni), cobalt (Co), chromium (Cr), or alloys thereof to provide functions such as thermal resistance, chemical resistance, or electrical resistance. Similarly, the second metal foil in the laminate may also be stacked onto the second surface of the LCP film in a direct or indirect contact manner. In one of the embodiments of the present application, the stacking manner for the LCP film and the first metal foil may be the same as that for the LCP film and the second metal foil. In still another embodiment, the stacking manner for the LCP film and the first metal foil may be different from that for the LCP film and the second metal foil.

In accordance with the present application, the first metal foil and/or the second metal foil may be, but are not limited to, copper foil, gold foil, silver foil, nickel foil, aluminum foil, stainless steel foil, etc. In one of the embodiments, the first metal foil and the second metal foil are made of different materials. Preferably, the first metal foil and/or the second metal foil may be copper foil, so that the copper foils and the LCP film are stacked to form a copper clad laminate (CCL). In addition, the method of preparing the first metal foil and/or the second metal foil are not particularly restricted, as long as the methods do not violate the objective of the present application. For example, the metal foil may be produced by, but not limited to, a roll-to-roll method or an electrodeposition method.

In accordance with the present application, the thickness of the first metal foil and/or the second metal foil is not particularly restricted and can be adjusted based on different needs by a person having ordinary skill in the art. For example, in one of the embodiments, the thickness of the first metal foil and/or the second metal foil may independently be in the range from 1 μm to 200 μm; preferably, the thickness of the first metal foil and/or the second metal foil may independently be in the range from 1 μm to 40 μm; more preferably, the thickness of the first metal foil and/or the second metal foil may independently be in the range from 1 μm to 20 μm; even more preferably, the thickness of the first metal foil and/or the second metal foil may independently be in the range from 3 μm to 20 μm.

In accordance with the present application, the first metal foil and/or the second metal foil of the present application can be subjected to a surface treatment based on different needs by a person having ordinary skill in the art. For example, the surface treatment may be selected from, but not limited to, roughening treatment, acid-base treatment, thermal treatment, degreasing treatment, ultraviolet irradiation treatment, corona discharge treatment, plasma treatment, primer coating treatment, etc.

In accordance with the present application, the roughness of the first metal foil and/or the second metal foil is not particularly restricted and can be adjusted according to different needs by a person having ordinary skill in the art. In one of the embodiments, the Rz of the first metal foil and/or the Rz of the second metal foil may independently be equal to or larger than 0.1 µm and smaller than or equal to 2.0 µm; preferably, the Rz of the first metal foil and/or the Rz of the second metal foil may independently be equal to or larger than 0.1 µm and smaller than or equal to 1.5 µm. In one of the embodiments, the Rz of the first metal foil and the Rz of the second metal foil may both fall within any of the aforementioned ranges. The Rz of the first metal foil and the Rz of the second metal foil may be the same or different as needed. In one of the embodiments, the Rz of the first metal foil and the Rz of the second metal foil both fall within any of the aforementioned ranges.

In one of the embodiments, a third metal foil may be additionally provided based on different needs by a person having ordinary skill in the art. The third metal foil may be disposed over the LCP film. The third metal foil may be the same as or different from the first metal foil and/or the second metal foil as needed. In one of the embodiments, the Rz of the third metal foil may fall within any of the aforementioned ranges of the Rz of the first metal foil and/or the Rz of the second metal foil.

In one of the embodiments, the laminate may comprise multiple LCP films. Based on the premise of not violating the spirit of the present application, multiple LCP films of the present application and multiple metal foils, such as the foresaid first metal foil, second metal foil, and/or third metal foil, may be stacked based on different needs to produce a laminate having the multiple LCP films and the multiple metal foils by a person having ordinary skill in the art.

In the specification, the thickness of the LCP film is directly measured by a thickness gauge. The transmittance of the LCP film is defined according to Standard Method ASTM D1003. The terms "Kurtosis (Sku)" and "arithmetical mean height of a surface (S a)" are defined according to Standard Method ISO

DETAILED DESCRIPTION OF THE PREFERRED EMBODIMENTS

Hereinafter, multiple preparation examples are provided to illustrate raw materials used to produce the LCP film of the present application. Multiple examples are further provided to illustrate the implementation of the LCP film and the laminate of the present application, while multiple comparative examples are provided as comparison. A person having ordinary skill in the art can easily realize the advantages and effects of the present application from the following examples and comparative examples. The descriptions proposed herein are just preferable embodiments for the purpose of illustrations only, not intended to limit the scope of the present application. Various modifications and variations could be made in order to practice or apply the present application without departing from the spirit and scope of the present application.

《LCP Resin》

Preparation Example 1: LCP Resin

A mixture of 6-hydroxy-2-naphthalenecarboxylic acid (700 g, 3.72 mole), 4-hydroxybenzoic acid (954 g, 6.91 mole), terephthalic acid (285 g, 1.71 mole), acetyl anhydride (1085 g) and sodium phosphite (1.3 g) was charged into a 3-liter autoclave and stirred for acetylation at 160° C. for about 2 hours under nitrogen atmosphere at normal pressure. Subsequently, the mixture was heated to 320° C. at a heating rate of 30° C. per hour. Under this temperature condition, the pressure was reduced slowly from 760 torr to 3 torr or below, and the temperature rose from 320° C. to 340° C. Afterwards, the stirring power and the pressure were increased, and steps of discharging polymers, drawing strands, and cutting strands into pellets were conducted to obtain an LCP resin having a melting point of about 265° C. and a viscosity of about 20 Pa s @300° C. Wherein, based on the total molar number of the structural unit in the LCP resin which could be represented by Formula (1), the molar number of the structural unit in the LCP resin represented by Formula (I) was about 30 mole %, and a sum of the molar numbers of the structural units in the LCP resin represented by Formulae (I) and (II) was 86 mole %.

Preparation Example 2: LCP Resin

A mixture of 6-hydroxy-2-naphthalenecarboxylic acid (540 g, 2.87 mole), 4-hydroxybenzoic acid (1071 g, 7.75 mole), acetyl anhydride (1086 g), sodium phosphite (1.3 g), and 1-methylimidazole (0.3 g) was charged into a 3-liter autoclave and stirred for acetylation at 160° C. for about 2 hours under nitrogen atmosphere at normal pressure. Subsequently, the mixture was heated to 320° C. at a heating rate of 30° C. per hour. Under this temperature condition, the pressure was reduced slowly from 760 torr to 3 torr or below, and the temperature rose from 320° C. to 340° C. Afterwards, the stirring power and the pressure were increased, and steps of discharging polymers, drawing strands, and cutting strands into pellets were conducted to obtain an LCP resin having a melting point of about 278° C. and a viscosity of about 45 Pa·s @300° C. Wherein, based on the total molar number of the structural unit in the LCP resin which could be represented by Formula (1), the structural unit in the LCP resin represented by Formula (I) was about 27 mole %, and a sum of the molar numbers of the structural units in the LCP resin represented by Formulae (I) and (II) was 100 mole %.

Preparation Example 3: LCP Resin

A mixture of 6-hydroxy-2-naphthalenecarboxylic acid (440 g, 2.34 mole), 4-hydroxybenzoic acid (1145 g, 8.29 mole), acetyl anhydride (1085 g) and sodium phosphite (1.3 g) was charged into a 3-liter autoclave and stirred for acetylation at 160° C. for about 2 hours under nitrogen atmosphere at normal pressure. Subsequently, the mixture was heated to 320° C. at a heating rate of 30° C. per hour. Under this temperature condition, the pressure was reduced slowly from 760 torr to 3 torr or below, and the temperature rose from 320° C. to 340° C. Afterwards, the stirring power and the pressure were increased, and steps of discharging polymers, drawing strands, and cutting strands into pellets were conducted to obtain an LCP resin having a melting point of about 305° C. and a viscosity of about 40 Pa s @320° C. Wherein, based on the total molar number of the structural unit in the LCP resin which could be represented by Formula (1), the structural unit in the LCP resin represented by Formula (I) was about 22 mole %, and a sum of the molar numbers of the structural units in the LCP resin represented by Formulae (I) and (II) was 100 mole %.

《LCP Film》

Examples 1 to 15 and Comparative Examples 1 to 4: LCP Films

The LCP resins obtained from Preparation Examples 1 to 3 (expressed as PE1 to PE3) were used as raw materials to prepare LCP films of Examples 1 to 15 (expressed as E1 to E15) and Comparative Examples 1 to 4 (expressed as C1 to C4) by the methods described below.

First, one of the LCP resins was put into an extruder having a screw diameter of 27 millimeters (mm) (manufacturer: Leistritz, model: ZSE27) and heated to a temperature ranging from 285° C. to 320° C., and then extruded from a T-die having a width of 500 mm at a feeding speed ranging from 5.5 kilograms per hour (kg/hr) to 8.5 kg/hr. The LCP resin was then delivered to a space between two casting wheels, which were spaced from the T-die by about 1 mm to 50 mm and each had a temperature ranging from about 250° C. to 320° C. and a diameter ranging from about 35 centimeters (cm) to 45 cm, extruded with a force of about 20 kilonewtons (kN) to 60 kN, and then transferred to a cooling wheel for cooling at room temperature, so as to obtain an LCP film having a thickness ranging from 15 μm to 100 μm.

The differences between the processes of Examples 1 to 15 and Comparative Examples 1 to 4 are: the kind of the LCP resin, the distance from the T-die to the surfaces of the casting wheels, the feeding speed, and the extrusion temperature. The manufacturing parameters of Examples 1 to 15 and Comparative Examples 1 to 4 are respectively listed in Table 1 below.

TABLE 1

Manufacturing parameters of preparing LCP films of Examples 1 to 15 and Comparative Examples 1 to 4

| Sample No. | LCP Resin | Distance from T-die to casting wheels (mm) | Feeding Speed (kg/hr) | Extrusion Temp. (° C.) |
|---|---|---|---|---|
| E1 | PE1 | 20 | 5.5 | 285 |
| E2 | PE2 | 20 | 5.5 | 300 |
| E3 | PE3 | 20 | 8.5 | 320 |
| E4 | PE1 | 20 | 6.5 | 285 |
| E5 | PE2 | 20 | 6.5 | 300 |
| E6 | PE3 | 20 | 7.5 | 315 |
| E7 | PE1 | 20 | 7.5 | 285 |
| E8 | PE2 | 20 | 6.5 | 305 |
| E9 | PE3 | 20 | 7.5 | 310 |
| E10 | PE1 | 20 | 8.5 | 285 |
| E11 | PE2 | 20 | 5.5 | 310 |
| E12 | PE3 | 20 | 8.5 | 310 |
| E13 | PE2 | 20 | 6.5 | 320 |
| E14 | PE1 | 20 | 8.5 | 285 |
| E15 | PE1 | 20 | 8.5 | 285 |
| C1 | PE2 | 10 | 5.5 | 280 |
| C2 | PE2 | 10 | 6.5 | 280 |
| C3 | PE2 | 10 | 7.5 | 280 |
| C4 | PE2 | 10 | 8.5 | 280 |

The above-mentioned preparation method of an LCP film is only used to exemplify implementation of the present application. A person having ordinary skill in the art may adopt conventional methods such as a laminate extension method and an inflation method to prepare an LCP film.

In one of the embodiments, after the LCP resin was extruded from the T-die, the LCP resin and two high-temperature resistant films were then delivered to a space between two casting wheels together to form a three-layered laminate as needed by a person having ordinary skill in the art. The two high-temperature resistant films were detached from the LCP resin after cooling to room temperature to obtain the LCP film of the present application. The high-temperature resistant film may be selected from, but not limited to, poly(tetrafluoroethene) (PTFE) film, polyimide (PI) film, and poly(ether sulfone) (PES) film.

Comparative Example 5: LCP Film

A wholly aromatic liquid crystalline polyester having a flow temperature of 323° C. was prepared from a mixture of 4-hydroxybenzoic acid, 4,4'-biphenol, terephthalic acid and phthalic acid. The molar ratio of 4-hydroxybenzoic acid:4, 4'-biphenol:terephthalic acid:phthalic acid was 60:20:15:5. Subsequently, the wholly aromatic liquid crystalline polyester (10 mg) and tetrafluorophenol (10 g) were mixed to form a mixture solution, and then the mixture solution was stirred at 60° C. to make it uniform and transparent. After that, this transparent solution was cast on a horizontal glass plate to form a film, and then the film was heated at 100° C. for 3 hours, so the solvent in the film was gradually evaporated during the heating process to obtain an LCP film. The LCP film had a thickness of 15 μm.

In addition, post treatments for the obtained LCP film may be conducted based on different needs by a person having ordinary skill in the art. The post treatments may be, but are not limited to, polishing, ultraviolet irradiation, plasma treatment, etc. For the plasma treatment, it may be applied with a plasma operated with a power of 1 kilowatt (kW) under nitrogen, oxygen, or air atmosphere at a reduced or normal pressure based on different needs, but is not limited thereto.

Test Example 1: Analysis of the Thickness of LCP Films

In this test example, the thickness of each of the LCP films of E1 to E15 and C1 to C5 was analyzed by a digital thickness micrometer (manufacturer: NIKON, model: MF-501). The thicknesses of E1 to E15 and C1 to C5 were respectively listed in Table 2 below.

Test Example 2: Analysis of the Transmittance of LCP Films

In this test example, each of the LCP films of E1 to E15 and C1 to C5 was cut into a sample of a size of 10 cm×10 cm. The transmittance of each sample was measured by a haze meter (manufacturer: Nippon denshoku, model: NDH5000) according to Standard Method ASTM D1003, and the results were listed in Table 2.

Moreover, the values of the thickness obtained from Test Example 1 and the corresponding values of the transmittance measured from Test Example 2 were put into Formula (III) for each of the LCP films of E1 to EIS and C1 to C5, and the obtained values of the LCP films of E1 to EIS and C1 to C5 were respectively listed in Table 2.

$$\mathrm{Log}(1/TT\ \%)/(\mathrm{Thickness})^{0.5} \qquad \text{Formula (III):}$$

Take Example 1 for example, the LCP film of Example 1 had a thickness of 15 μm and a transmittance of 55% (i.e. 0.55), so the concerning Formula (III) was typed as $\mathrm{Log}(1/0.55)/(15)^{0.5}=0.0670$.

TABLE 2

Thickness, transmittance and value obtained from Formula (III) of LCP films of Examples 1 to 15 and Comparative Examples 1 to 5

| Sample No. | Thickness | Transmittance (%) | Value obtained from Formula (III) |
|---|---|---|---|
| E1 | 15 μm | 55 | 0.0670 |
| E2 | 15 μm | 51 | 0.0755 |
| E3 | 15 μm | 46 | 0.0871 |

TABLE 2-continued

Thickness, transmittance and value obtained from Formula (III) of
LCP films of Examples 1 to 15 and Comparative Examples 1 to 5

| Sample No. | Thickness | Transmittance (%) | Value obtained from Formula (III) |
|---|---|---|---|
| E4 | 25 μm | 49 | 0.0620 |
| E5 | 25 μm | 42 | 0.0754 |
| E6 | 25 μm | 36 | 0.0887 |
| E7 | 50 μm | 38 | 0.0594 |
| E8 | 50 μm | 32 | 0.0700 |
| E9 | 50 μm | 26 | 0.0827 |
| E10 | 100 μm | 24 | 0.0620 |
| E11 | 100 μm | 19 | 0.0721 |
| E12 | 100 μm | 16 | 0.0796 |
| E13 | 50 μm | 29 | 0.0760 |
| E14 | 50 μm | 37 | 0.0611 |
| E15 | 25 μm | 49 | 0.0620 |
| C1 | 15 μm | 36 | 0.1146 |
| C2 | 25 μm | 26 | 0.1170 |
| C3 | 50 μm | 19 | 0.1020 |
| C4 | 100 μm | 8 | 0.1097 |
| C5 | 15 μm | 56 | 0.0650 |

From the calculation results shown in Table 2, the values obtained from Formula (III) of E10, E14 and E15 were similar. Evidently, when the LCP films with different thickness are prepared by the same LCP resin with similar manufacturing parameters, the difference in thickness of the LCP films will not cause an obvious variation in values obtained from Formula (III). This showed that the relations between the thickness and the transmittance of the LCP film could be expressed by Formula (III).

Test Example 3: Analysis of the Surface Characteristics of LCP Films

The surface morphology images of the LCP films of E1 to E13 and C1 to C4 were taken by using a laser scanning confocal microscope. Then, Sku and Sa of the surface of each of the LCP films were respectively analyzed according to Standard Method ISO 25178-2:2012. The results of Sku of E1 to E13 and C1 to C4 were respectively listed in Table 4; the results of Sa of E1 to E13 were respectively listed in Table 5. The relevant instrument and test conditions were recorded as follows.

1. Instrument:
(1) Laser scanning confocal microscope: manufacturer: Olympus, model: LEXT OLS5000-SAF;
(2) Objective lenses: MPLAPON-100×LEXT.
2. Test Conditions:
(1) Analytical environment: temperature of 24±3° C. and a relative humidity of 63±3%;
(2) Light source: 405 nm-wavelength;
(3) Objective lens magnification: 100× magnification;
(4) Optical zoom: 1.0×;
(5) Image area: 129 μm×129 μm;
(6) Resolution: 1024 pixels×1024 pixels;
(7) Condition setting: auto tilt removal;
(8) Filter setting: no filter.

Examples 1A to 13A and Comparative Examples 1A to 5A

Laminates

Laminates of Examples 1A to 13A (expressed as E1A to E13A) and Comparative Examples 1A to 5A (expressed as C1A to C5A) were respectively produced from the LCP films of Examples 1 to 13 and Comparative Examples 1 to 5 stacked to the commercially available copper foils. The commercially available copper foils were purchased from FUKUDA METAL Co., Ltd. (model: CF-H9A-HD2) and had an Rz of about 1.0 μm.

The LCP films of E1 to E13 and C1 to C5 and the commercially available copper foils with a thickness of about 12 μm were provided. First, the LCP films and the commercially available copper foils were each cut into a size of 20 cm×20 cm. Each of the LCP films of E1 to E13 and C1 to C5 was then sandwiched between two commercially available copper foils to form a laminated structure. The laminated structure was subjected to a lamination process with a pressure of 5 kilograms per square centimeter (kg/cm$^2$) for 60 seconds at 180° C., followed by another lamination process with a pressure of 20 kg/cm$^2$ for 25 minutes (min) at 300° C., and then cooled to room temperature to obtain a laminate. The kinds of the LCP film used for each of the laminates of Examples 1A to 13A and Comparative Examples 1A to 5A were listed in Table 3.

Herein, the lamination method for the laminates is not particularly restricted. A person having ordinary skill in the art may use conventional techniques such as wire lamination or surface lamination to conduct the lamination process. A laminator applicable to the present application may be, but is not limited to, an intermittent hot-press machine, a roll-to-roll wheeling machine, a double belt press machine, etc. According to different needs, a person having ordinary skill in the art can also align the LCP film with the copper foils to form a laminated structure, which may then be subjected to a heating step and a pressing step to complete surface lamination.

In another one embodiment, a metal foil, such as a copper foil, on an LCP film may be formed through sputtering, electroplating, chemical plating, evaporation deposition, etc. based on different needs by a person having ordinary skill in the art. Or, a connection layer, such as an adhesive layer, a nickel layer, a cobalt layer, a chromium layer, or an alloy layer thereof, may be formed between an LCP film and a metal foil based on different needs by a person having ordinary skill in the art.

Test Example 4: Analysis of Insertion Loss of Laminates

In this test example, the laminates of E1A to E13A and C1A to C5A were each cut into a strip line specimen having a length about 100 mm, a width ranging from about 100 μm to 250 μm, and a resistance about 50 Ohm (Ω). The insertion loss of the strip line specimens of E1A to E13A and C1A to C5A was respectively measured under a frequency of 10 GHz by a microwave network analyzer (manufacturer: Agilent Technologies, Ltd., model: 8722ES) including a probe (manufacturer: Cascade Microtech, model: ACP40-250).

For the kind of the laminate having an LCP film with a thickness of 15 μm, in the case that the laminate had an insertion loss of −3.9 dB/10 cm or less, the evaluation result for insertion loss of the laminate was represented by "0"; otherwise, in the case that the laminate had an insertion loss of −4.0 dB/10 cm or more, the evaluation result for insertion loss of the laminate was represented by "X".

For the kind of the laminate having an LCP film with a thickness of 25 μm, in the case that the laminate had an insertion loss of −3.6 dB/10 cm or less, the evaluation result for insertion loss of the laminate was represented by "0"; otherwise, in the case that the laminate had an insertion loss of −3.7 dB/10 cm or more, the evaluation result for insertion loss of the laminate was represented by "X".

For the kind of the laminate having an LCP film with a thickness of 50 μm, in the case that the laminates had an insertion loss of −2.9 dB/10 cm or less, the evaluation result for insertion loss of the laminate was represented by "O"; otherwise, in the case that the laminate had an insertion loss of −3.0 dB/10 cm or more, the evaluation result for insertion loss of the laminate was represented by "X".

For the kind of the laminates having an LCP film with a thickness of 100 μm, in the case that the laminate had an insertion loss of −2.2 dB/10 cm or less, the evaluation result for insertion loss of the laminate was represented by "O"; otherwise, in the case that the laminate had an insertion loss of −2.3 dB/10 cm or more, the evaluation result for insertion loss of the laminate was represented by "X".

The evaluation results for insertion loss of the laminates of E1A to E13A and C1A to C5A were shown in Table 3.

TABLE 3

Thickness, transmittance, value obtained from Formula (III) of LCP films of E1 to E13 and C1 to C5 and the evaluation result for insertion loss of the laminates of E1A to E13A and C1A to C5A

| | LCP Film | | | Laminate | |
|---|---|---|---|---|---|
| Sample No. | Thickness | TT % | Value obtained from Formula (III) | Sample No. | Insertion Loss |
| E1 | 15 μm | 55 | 0.0670 | E1A | O |
| E2 | 15 μm | 51 | 0.0755 | E2A | O |
| E3 | 15 μm | 46 | 0.0871 | E3A | O |
| E4 | 25 μm | 49 | 0.0620 | E4A | O |
| E5 | 25 μm | 42 | 0.0754 | E5A | O |
| E6 | 25 μm | 36 | 0.0887 | E6A | O |
| E7 | 50 μm | 38 | 0.0594 | E7A | O |
| E8 | 50 μm | 32 | 0.0700 | E8A | O |
| E9 | 50 μm | 26 | 0.0827 | E9A | O |
| E10 | 100 μm | 24 | 0.0620 | E10A | O |
| E11 | 100 μm | 19 | 0.0721 | E11A | O |
| E12 | 100 μm | 16 | 0.0796 | E12A | O |
| E13 | 50 μm | 29 | 0.0760 | E13A | O |
| C1 | 15 μm | 36 | 0.1146 | C1A | X |
| C2 | 25 μm | 26 | 0.1170 | C2A | X |
| C3 | 50 μm | 19 | 0.1020 | C3A | X |
| C4 | 100 μm | 8 | 0.1097 | C4A | X |
| C5 | 15 μm | 56 | 0.0650 | C5A | X |

Test Example 5: Analysis of Peel Strength of Laminates

In this test example, the peel strength of the laminates was measured according to the test method IPC-TM-650 No.: 2.4.9. The laminates of E1A to E13A and C1A to C4A were each cut into an etched specimen having a length of about 228.6 mm and a width of about 3.2 mm. Each etched specimen was placed at a temperature of 23±2° C. and a relative humidity of 50±5% for 24 hours to reach stabilization. Subsequently, each etched specimen was adhered to a clamp of a testing machine (manufacturer: Hung Ta Instrument Co., Ltd., model: HT-9102) with a double-sided adhesive tape. Each etched specimen was then peeled from the clamp with a force at a peel speed of 50.8 mm/min, and the value of the force during the peeling process was continuously recorded. Herein, the force should be controlled within a range of 15% to 85% of the bearable force of the testing machine, the peeling distance from the clamp should be at least more than 57.2 mm, and the force for the initial distance of 6.4 mm was neglected and not recorded. The results were listed in Tables 4 and 5.

TABLE 4

Sku of LCP films of E1 to E13 and C1 to C4 and the peel strength of the laminates of E1A to E13A and C1A to C4A

| | | Laminate | |
|---|---|---|---|
| Sample No. | LCP Film Sku | Sample No. | Peel Strength (kg/cm) |
| E1 | 35.8 | E1A | 1.12 |
| E2 | 149 | E2A | 1.15 |
| E3 | 235 | E3A | 1.17 |
| E4 | 25.2 | E4A | 1.23 |
| E5 | 169 | E5A | 1.26 |
| E6 | 218 | E6A | 1.24 |
| E7 | 15.6 | E7A | 1.34 |
| E8 | 157 | E8A | 1.38 |
| E9 | 249 | E9A | 1.42 |
| E10 | 19.8 | E10A | 1.32 |
| E11 | 135 | E11A | 1.39 |
| E12 | 236 | E12A | 1.42 |
| E13 | 9.8 | E13A | 0.93 |
| C1 | 13.6 | C1A | 0.89 |
| C2 | 12.3 | C2A | 0.96 |
| C3 | 9.5 | C3A | 0.98 |
| C4 | 10.6 | C4A | 0.96 |

TABLE 5

Sa of LCP films of E1 to E13 and the peel strength of the laminates of E1A to E13A

| | | Laminate | |
|---|---|---|---|
| Sample No. | LCP Film Sa (μm) | Sample No. | Peel Strength (kg/cm) |
| E1 | 0.03 | E1A | 1.12 |
| E2 | 0.08 | E2A | 1.15 |
| E3 | 0.11 | E3A | 1.17 |
| E4 | 0.04 | E4A | 1.23 |
| E5 | 0.08 | E5A | 1.26 |
| E6 | 0.12 | E6A | 1.24 |
| E7 | 0.05 | E7A | 1.34 |
| E8 | 0.11 | E8A | 1.38 |
| E9 | 0.187 | E9A | 1.42 |
| E10 | 0.04 | E10A | 1.32 |
| E11 | 0.09 | E11A | 1.39 |
| E12 | 0.19 | E12A | 1.42 |
| E13 | 0.02 | E13A | 0.93 |

Discussion on Test Results

The LCP resins used to prepare the LCP films of E1 to E13 all had the structural unit which conformed to Formula (I) and the structural unit which conformed to Formula (II). In each of the aforesaid LCP resins, the molar number of the structural unit represented by Formula (I) was in the range from 15 mole % to 40 mole %, and the sum of the molar numbers of the structural units represented by Formulae (I) and (II) was in the range from larger than 85 mole % to 100 mole %. Furthermore, the thickness and the transmittance of the LCP films of E1 to E13 were simultaneously controlled, and, when the values of the thickness and the transmittance of the LCP films of E1 to E13 were put into Formula (III), the obtained values of Formula (III) were within a specific range of larger than 0.055 and smaller than 0.090. Therefore, the laminates which were produced from such LCP films and the commercially available copper foils (i.e. E1A to E13A) had low roughness, and all of these laminates exhibited an advantage of low insertion loss at a high frequency such as 10 GHz.

As the results of the peel strength shown in Table 4, when the Sku of the surface of the LCP film was larger than or equal to 10 and smaller than or equal to 300, the LCP film had a good peel strength with the copper foil. When the Sku of the surface of the LCP film was further controlled as a value larger than or equal to 15 and smaller than or equal to 300, the peel strength between the LCP film and the copper foil could be larger than 1 kg/cm. That is, by controlling the Sku of the surface of the LCP film, the peel strength of the laminate will be further enhanced.

As the results of the peel strength shown in Table 5, when the Sa of the surface of the LCP film was larger than or equal to 0.02 μm and smaller than or equal to 0.29 μm, the LCP film had a good peel strength with the copper foil. When the Sa of the surface of the LCP film was further controlled as a value larger than or equal to 0.03 μm and smaller than or equal to 0.20 μm, the peel strength between the LCP film and the copper foil could be larger than 1 kg/cm. That is, by controlling the Sa of the surface of the LCP film, the peel strength of the laminate will be further enhanced.

In summary, by controlling the structural units and the content thereof of the LCP resin used to prepare the LCP film and controlling the thickness and the transmittance of the LCP film, the resulting value obtained from Formula (III) can be controlled within a specific range. Therefore, the laminate containing the LCP film can concretely reduce insertion loss. In addition to the aforementioned technical means for reducing the insertion loss of the laminate, the peel strength between the LCP film and the metal foil in the laminate can also be improved by further combining the technical means of controlling the surface characteristics such as Sku and/or Sa of at least one surface of the LCP film. Therefore, the laminate of the present application is highly suitable for high-end 5G products.

Even though numerous characteristics and advantages of the present application have been set forth in the foregoing description, together with details of the structure and features of the present application, the disclosure is illustrative only. Changes may be made in the details, especially in matters of shape, size, and arrangement of parts within the principles of the present application to the full extent indicated by the broad general meaning of the terms in which the appended claims are expressed.

What is claimed is:

1. A liquid crystal polymer film, wherein a material of the liquid crystal polymer film is a liquid crystal polymer resin comprising a structural unit represented by Formula (1):

-L$_1$-Ar-L$_2$-    (1);

wherein -L$_1$- and -L$_2$- are respectively —O— or —CO—;
—Ar— is an arylene group;
wherein Formula (1) comprises structural units as follows:

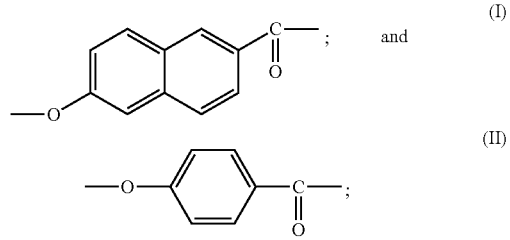

wherein based on a total molar number of the structural unit represented by Formula (1), a molar number of the structural unit represented by Formula (I) is in the range from 15 mole % to 40 mole %, and a sum of molar numbers of the structural units represented by Formulae (I) and (II) is in the range from 80 mole % to 100 mole %;
wherein the liquid crystal polymer film has a thickness in the unit of μm and a transmittance (TT %), wherein when values of the thickness and the transmittance are put into Formula (III): $\log(1/TT\%)/(thickness)^{0.5}$, an obtained value is larger than 0.055 and smaller than 0.090;
wherein the liquid crystal polymer film comprises a first surface and a second surface opposite each other, and a Kurtosis (Sku) of the first surface is equal to or larger than 1 and smaller than or equal to 300.

2. The liquid crystal polymer film as claimed in claim 1, wherein the thickness of the liquid crystal polymer film is in the range from 10 μm to 200 μm.

3. The liquid crystal polymer film as claimed in claim 1, wherein the thickness of the liquid crystal polymer film is in the range from 15 μm to 100 μm.

4. The liquid crystal polymer film as claimed in claim 1, wherein the transmittance of the liquid crystal polymer film is equal to or larger than 8% and smaller than 60%.

5. The liquid crystal polymer film as claimed in claim 1, wherein the transmittance of the liquid crystal polymer film is equal to or larger than 15% and smaller than or equal to 55%.

6. The liquid crystal polymer film as claimed in claim 1, wherein the Sku of the first surface is equal to or larger than 10 and smaller than or equal to 300.

7. The liquid crystal polymer film as claimed in claim 1, wherein the Sku of the first surface is equal to or larger than 15 and smaller than or equal to 300.

8. The liquid crystal polymer film as claimed in claim 1, wherein an arithmetical mean height of a surface (Sa) of the first surface is smaller than or equal to 0.29 μm.

9. The liquid crystal polymer film as claimed in claim 8, wherein the Sa of the first surface is equal to or larger than 0.02 μm and smaller than or equal to 0.29 μm.

10. The liquid crystal polymer film as claimed in claim 8, wherein the Sa of the first surface is equal to or larger than 0.03 μm and smaller than or equal to 0.20 μm.

11. The liquid crystal polymer film as claimed in claim 1, wherein based on the total molar number of the structural unit represented by Formula (1), the molar number of the structural unit represented by Formula (I) is in the range from 22 mole % to 27 mole %, and the sum of the molar numbers of the structural units represented by Formulae (I) and (II) is 100 mole %.

12. A laminate, comprising a first metal foil and the liquid crystal polymer film as claimed in claim 1, wherein the liquid crystal polymer film comprises a first surface and a second surface opposite each other, and the first metal foil is disposed over the first surface of the liquid crystal polymer film.

13. The laminate as claimed in claim 12, wherein the laminate comprises a second metal foil, and the second metal foil is disposed over the second surface of the liquid crystal polymer film.

* * * * *